US010907074B2

(12) United States Patent
McDonough et al.

(10) Patent No.: US 10,907,074 B2
(45) Date of Patent: Feb. 2, 2021

(54) POLISHING COMPOSITIONS FOR REDUCED DEFECTIVITY AND METHODS OF USING THE SAME

(71) Applicant: FUJIFILM ELECTRONIC MATERIALS U.S.A., INC., North Kingstown, RI (US)

(72) Inventors: James McDonough, Gilbert, AZ (US); Saul Alvarado, Tempe, AZ (US)

(73) Assignee: FUJIFILM ELECTRONIC MATERIALS U.S.A., INC., North Kingstown, RI (US)

( * ) Notice: Subject to any disclaimer, the term of this patent is extended or adjusted under 35 U.S.C. 154(b) by 0 days.

(21) Appl. No.: 16/503,198

(22) Filed: Jul. 3, 2019

(65) Prior Publication Data
US 2021/0002511 A1 Jan. 7, 2021

(51) Int. Cl.
C09G 1/02 (2006.01)
H01L 21/306 (2006.01)
H01L 21/321 (2006.01)
C09G 1/04 (2006.01)

(52) U.S. Cl.
CPC ............. *C09G 1/02* (2013.01); *C09G 1/04* (2013.01); *H01L 21/30625* (2013.01); *H01L 21/3212* (2013.01)

(58) Field of Classification Search
CPC ......... C09G 1/02; C09G 1/04; H01L 21/3212; H01L 21/30625
See application file for complete search history.

(56) References Cited

U.S. PATENT DOCUMENTS

| 2001/0055940 | A1  | 12/2001 | Swanson |
| 2003/0064671 | A1* | 4/2003  | Pasqualoni .......... C09K 3/1463 451/308 |
| 2003/0203705 | A1  | 10/2003 | Leng |
| 2004/0159050 | A1* | 8/2004  | Pasqualoni ............. C09G 1/02 51/307 |
| 2006/0124593 | A1* | 6/2006  | Moyaerts ............. C09K 3/1463 216/88 |
| 2016/0053136 | A1  | 2/2016  | McDonough et al. |
| 2018/0094166 | A1  | 4/2018  | Guo et al. |

OTHER PUBLICATIONS

Juta et al; "Continous Monitoring and Control of CMP Slurry Health"; NCCAVS CMPUG 10th Annual Int. Symp.; Oct. 5, 2005; p. 5, heading Measurement of Large Particle Behavior in a Silica Abrasive Oxide CMP Slurry; pg., Figure 5.
International Search Report dated Oct. 18, 2019 for PCT application No. PCT/US2019/045489.
Written Opinion dated Oct. 18, 2019 for PCT application No. PCT/US2019/045489.

* cited by examiner

*Primary Examiner* — Duy Vu N Deo
(74) *Attorney, Agent, or Firm* — Ohlandt, Greeley, Ruggiero and Perle, LLP

(57) ABSTRACT

Chemical mechanical polishing compositions include an abrasive, a first removal rate enhancer; and water; wherein the polishing compositions have a value of less than 800,000 for the relation: large particle counts/weight percent abrasive, when measured using a 0.2 μm bin size.

16 Claims, 11 Drawing Sheets

POLISHING COMPOSITIONS FOR REDUCED DEFECTIVITY AND METHODS OF USING THE SAME

BACKGROUND OF THE DISCLOSURE

1. Field of the Disclosure

The present disclosure relates to chemical-mechanical polishing compositions. More particularly, the present disclosure relates to such compositions that have large particle counts below a desired threshold.

2. Description of the Related Art

Copper is a commonly used material for forming interconnects in semiconductor manufacturing. Once a copper inlaid structure is formed by, for example, a damascene process, the isolated copper wires are made by polishing and clearing copper and barrier metal between the inlaid wires. Copper and barrier layer CMP involves polishing of copper and barrier layers. It is desired to polish the wafers at a high removal rate of material to enhance throughput, while still maintaining favorable wafer characteristics such as a low number of overall defects.

The process known as chemical mechanical polishing or planarization (CMP) involves the polishing/planarization of different layers on semiconductor wafers using a polishing pad and slurry to polish away excess or unwanted layers of materials prior to construction of subsequent layers. Copper is a commonly used material for forming interconnects in semiconductor manufacturing. Once a copper inlaid structure is formed by, for example, a damascene process which deposits copper according to the pattern dictated by, for example a damascene process, the isolated copper wires are made by polishing and clearing copper and barrier metal between the inlaid wires.

Copper and barrier layer CMP involves using a polishing slurry or multiple polishing slurries to remove copper and barrier layers to the extent required to proceed to the next step in the semiconductor manufacturing process. A typical copper CMP process consists of 3 process steps. First, the electro-plated copper overburden (which may be up to 5 μm or more in thickness depending on technology node) is rapidly polished down at a relatively high down force, leaving some amount of copper until the deposition topography is fully planarized. The remaining copper overburden after full planarization during the first step is polished off at a lower down force, with a stop on the barrier layer. High removal rates, to increase throughput, combined with planarization efficiency and low defects are key needs for a CMP process. Particularly, undesirable deep scratches from the copper CMP steps may persist during later stages of chip fabrication if they are of sufficient depth not to be removed in subsequent barrier polishing. These types of scratches can ultimately compromise device performance and lead to non-functioning devices and reduced die yield.

CMP processes are similarly used to polish substrates including metals other than copper and/or dielectric materials (while also possibly additionally including copper). Accordingly, improved polishing compositions and methods of their use are sought after in the semiconductor industry.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to chemical mechanical polishing compositions that include an abrasive, a first removal rate enhancer; and water; wherein the polishing composition has a value of less than 800,000 for the relation: large particle counts/weight percent abrasive, when measured using a 0.2 μm bin size. The present disclosure also provides a method of polishing a substrate with the compositions.

In another aspect, embodiments disclosed herein relate to chemical mechanical polishing compositions that include an abrasive, a first removal rate enhancer; and water; wherein the polishing composition has a value of less than 50,000 for the relation: large particle counts/weight percent solids, when measured using a 0.2 μm bin size.

In another aspect, the present disclosure provides a method of preparing a polishing composition, wherein the polishing composition comprises an abrasive, a first removal rate enhancer, and water. The polishing composition has a value of less than 800,000 for the relation: large particle counts/weight percent abrasive, when measured using a 0.2 μm bin size. The method comprises the steps of selecting the abrasive so that it conforms to the value, and combining the abrasive, the first removal rate enhancer, and the water.

Other aspects and advantages of the claimed subject matter will be apparent from the following description and the appended claims.

DETAILED DESCRIPTION OF THE DISCLOSURE

Figure 1:
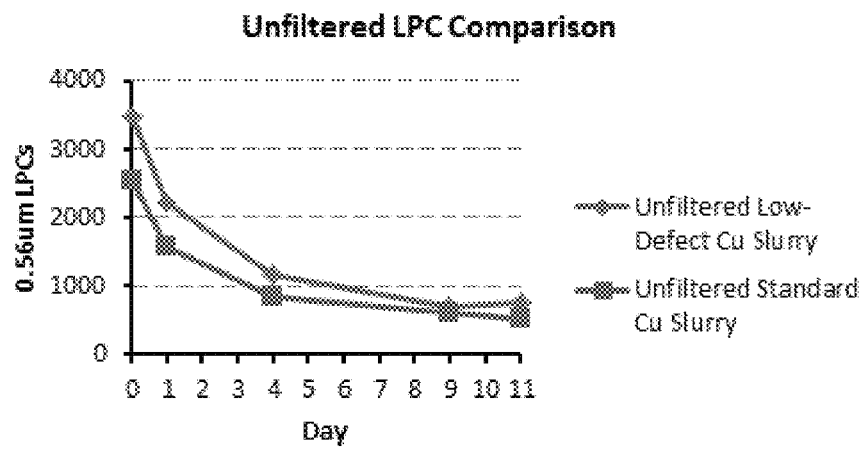
FIG. 1 shows LPC counts for an unfiltered slurry of the prior art (in FIGS. 1-13, the "Standard slurry"), and an unfiltered composition according to the present disclosure (in FIGS. 1-13, the "Low-Defect slurry"), using a bin size of 0.56 μm.

Embodiments disclosed herein provide chemical mechanical polishing compositions that are capable of minimizing defects, in particular microscratches, when compared to known CMP compositions. The compositions of the disclosure include an abrasive with a large particle count (LPC) that is specifically limited to be below a defined level. The deleterious effects of higher levels of LPCs (e.g., high level of defects) are thereby avoided or minimized when employing the compositions of the disclosure, while still maintaining the same, or higher, degree of polishing activity.

The compositions of the present disclosure have a large particle count (LPC), which refers to the number of particles greater than a certain size, below a certain threshold. In the CMP field, a tangible correlation has remained elusive between the LPCs of a composition and the number of defects (e.g. scratches) on the polished surface. The present inventors have surprisingly discovered that there is a clear improved result when the number of LPCs of a composition are kept below a certain amount with respect to the amount of abrasive (or solids) in the composition.

LPCs in CMP slurries may come from the abrasives used in the slurries, or other components added as solids during slurry formulation that may dissolve over time, but may do so slowly and/or incompletely (e.g., corrosion inhibitors, removal rate enhancers, etc.). As will be explained in further detail in this application, the present inventors have found that scratches or defects may be minimized during polishing, while maintaining the same, or higher, polishing rate, by using a polishing composition that includes less than 800,000 LPCs/weight percent abrasive (i.e., a value less than 800,000 LPCs for the relation: large particle counts/weight percent abrasive), when LPCs are measured using a 0.2 µm bin size (i.e., when LPCs are classified as particles larger than 0.2 µm). Further, and relatedly, polishing compositions that have less than 50,000 LPCs/weight percent solids (i.e., a value less than 50,000 LPCs for the relation: large particle counts/weight percent of components added as solids during formulation), when LPCs are measured using a 0.2 µm bin size, also achieve fewer wafer defects and scratching than compositions having a higher LPC/weight percent solids reading. Percent solids is intended to be distinct from percent abrasives in that percent solids encompass all components added during formulation in a solid form, some of which may ultimately dissolve or partially dissolve upon aging. Standardizing the LPC count to either the weight percent abrasive or weight percent solids allows for direct comparison of compositions regardless of their overall composition as the inventors have observed that higher scratches are observed for a wide variety of compositions (e.g., those with 0.08 wt % to those with 10 wt % abrasive) if they have LPC counts outside of the ranges referenced above.

As discussed in greater detail below, the benefits described in the present disclosure were surprising because they did not appear when LPCs were measured using a conventional higher threshold value than the threshold identified herein. The benefits of the claimed ratio only appear when measuring the LPCs using the smaller bin sizes discussed below. In addition, it was previously thought that the removal rate enhancers of CMP compositions contributed significantly to LPCs and defects, but the present disclosure sets forth that the abrasives were the biggest contributors to scratching defects. This is why the ratio of the present disclosure uses a smaller LPC threshold that is more directed to encompass the abrasive particles in the composition. As is also discussed below, significant benefits occur when the compositions meet the limits of the claimed ratio.

As mentioned above, undesirable deep scratches from the CMP steps may persist during later stages of chip fabrication if they are of sufficient depth not to be removed in any subsequent polishing steps. These types of scratches can ultimately compromise device performance, and one of the potential culprits behind deep scratches may be large undesirable particles present in the CMP slurry. The presence of these undesirable particles is typically monitored by light scattering techniques to determine LPCs, in which the concentrations of particles with diameters above a selected threshold, conventionally around 0.5 micrometers (µm) and/or around 1.0 µm, are quantified in solution. The conventionally selected size threshold (e.g., 0.5 µm and/or 1.0 µm) is typically well above the 99th percentile for the size distribution of desired particles (e.g., abrasives) in solution and thus prohibits confusion as to whether or not particles contributing to LPCs in slurries are undesirable (e.g., a contaminant) or desirable. However, the inventors have surprisingly discovered that the portion of the abrasive particles above about 0.2 µm is highly correlated with increased scratching. Thus, a portion of the abrasive, which is commonly believed to be desirable due to the need to achieve satisfactory removal rates and overall polishing performance, is actually detrimental and contributes significantly to highly undesirable scratching during polishing.

As will be demonstrated in the Examples presented later in this disclosure, the inventors have discovered that controlling the LPCs/weight percent abrasive to be less than 800,000, when LPCs are measured using a 0.2 µm bin size, results in polishing compositions that achieve reduced wafer defects/scratches when compared with a similarly formulated polishing composition that has a higher LPC/weight percent abrasive, when LPCs are measured using a 0.2 µm bin size. Without being bound by theory, the inventors believe that the reduction in defects/scratches is achieved when adhering to the above LPC limit due to the LPC limit reducing the relative amount of the larger abrasives in the compositions, which are most likely to create the scratches due to their hardness and size. Indeed, in the background section of U.S. Pat. No. 9,914,852 it is discussed that particles greater than about 0.5 µm are thought to present potential scratching problems, but there is no mention therein about the importance of limiting particles greater than 0.2 µm to reducing defects/scratches during polishing, as is demonstrated in the present application.

In polishing slurries LPCs are dominated by the abrasives when measured at a 0.2 µm bin size, whereas the abrasive component is much less represented in measurements using larger bin sizes (e.g., about 0.5 µm and about 1 µm) due to the typical size selections used for the abrasives used in polishing compositions. Abrasives used in polishing compositions have particle size distributions which may be significantly different depending on the synthesis method or parameters of the synthesis process even though two different abrasives may have similar, or even the same, average particle size. For example, taking two abrasive sources each having an average particle size of 60 nm, one abrasive source may have a broader particle size distribution and a larger proportion of particles that are greater than 200 nm (i.e., above a 0.2 µm bin size) than the other abrasive source that has a narrower particle size distribution. Consequently, the LPCs for the broader distribution abrasive source would be higher (and potentially outside of the limit referenced in this disclosure) when measured at a 0.2 µm bin size than the narrower distribution abrasive source even though they have the same average particle size.

The considerations discussed in the preceding paragraph are one reason why currently available slurries or compositions cannot be assumed to possess the properties of the present disclosure. Current slurries may have particle sizes that are similar on average, but again, that does not mean that they would have the same LPC counts at the described bin sizes. Furthermore, as described earlier in the present specification, there is no indication that there could or would be such a divergence in the LPC counts of the present compositions as compared to what is currently available, since the difference were not at all apparent at larger bin sizes. The abrasives of the present disclosure should be selected so that they achieve the desired LPC count and ratio. As established earlier in the disclosure, even filtering slurries will not necessarily mean that the LPCs will be reduced to the threshold levels of the present disclosure. The abrasives of the present disclosure may also be chemically treated to or formed with a particular chemical synthesis to ensure that they meet the desired LPC properties.

In practice, a filtration process may be used to attempt to remove particles larger than a certain size from a product or slurry formulation. However, even the use of filtration may not always be effective for lowering LPCs to a level where scratches or defects are minimized. For example, and as will be shown in the Examples presented later in the disclosure, 0.1 µm depth filters are not effective at reducing the LPCs below the threshold of 800,000 LPCs/weight percent abrasives or 50,000 LPCs/weight percent solids. This is not intuitive as one would expect filters with having a 0.1 µm pore diameter would be capable of significantly reducing the occurrence of particles capable of causing counts in the 0.2 µm bin size, which includes particles larger than 0.2 µm. However, depth filters have a wide distribution of pore sizes and allow at least a portion of components larger than the rated value through the filter. Thus, in one or more embodiments, a polishing slurry of the present disclosure is not filtered after formulation and/or the abrasive component used in the polishing slurry is not filtered before formulation. For example, when abrasives are provided by a supplier they are usually dispersed within a solution which is then mixed together with the other components to formulate a slurry. Thus, in some embodiments, the dispersed abrasive solution provided by a supplier is not filtered prior to being formulated into a polishing slurry.

In one or more embodiments, the polishing composition includes an abrasive selected from the group consisting of alumina, fumed silica, colloidal silica, coated particles, titania, ceria, zirconia, and any mixtures thereof. In one or more embodiments, the abrasive is selected from the group consisting of fumed silica, colloidal silica, and mixtures thereof.

In one or more embodiments, the polishing composition includes a removal rate enhancer selected from the group consisting of organic acids, and organic acid salts. In more specific embodiments, the removal rate enhancer is selected from the group consisting of amino acids, carboxylic acids, polyamines, ammonia based compounds, quaternary ammonium compounds, inorganic acids, compounds with both carboxylic and amino functions, ethylenediaminetetraacetic acid, diethylene triamine pentaacetic acid, and any mixtures thereof.

In one or more embodiments, the polishing composition includes a corrosion inhibitor selected from the group consisting of azole, azole derivatives, and mixtures thereof. In more specific embodiments, the corrosion inhibitor may be selected from the group consisting of benzotriazole, benzotriazole derivatives, tolyltriazole, and mixtures thereof.

In one or more embodiments, the polishing composition includes an oxidizer selected from the group consisting of hydrogen peroxide, ammonium persulfate, silver nitrate, ferric nitrates, ferric chloride, per acid, per salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMnO_4$, other inorganic or organic peroxides, and any mixtures thereof.

In one or more embodiments, the polishing composition includes at least one selected from the group consisting of a surfactant, a second removal rate enhancer, a biocide, a surface finisher, a pH adjuster, a defect reduction agent, a dishing reducer, a dynamic surface tension reducer, or any mixtures thereof.

In one or more embodiments, the polishing composition described herein can be substantially free of one or more of certain ingredients, such as salts (e.g., halide salts), polymers (e.g., cationic or anionic polymers, or polymers other than a dishing reducing agent), surfactants (e.g., those other than a copper corrosion inhibitor), plasticizers, oxidizing agents, corrosion inhibitors (e.g., non-azole corrosion inhibitors), and/or certain abrasives (e.g., ceria or alumina abrasives or non-ionic abrasives). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing compositions described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing compositions. In some embodiments, the polishing compositions described can be completely free of one or more the above ingredients.

EXAMPLES

In the examples presented below, the referenced LPC measurements for the 0.2 µm, 0.29 µm, 0.56 µm, and 1.01

μm bin sizes were measured over time using a Celerity (Tualatin, Oreg.) Slurry Particle Measuring Cart model AD10300-01 fitted with a Particle Measuring Systems Inc. (Boulder, Colo.) Liquilaz S02 liquid optical particle counter. All samples were diluted within the cart with 0.04 μm filtered deionized water by a factor of 500-1000 in order to bring counts to a level suitable for the S02 particle counter. The reported LPC's take into account all dilutions (FIGS. 1-4). Furthermore, in certain examples the results were normalized by % Silica loading (FIG. 15 and FIG. 16), as well as by % Solids loading (FIG. 17 and FIG. 18).

Example 1

In this example the variation of the LPC count over a period of eleven days was measured at multiple bin sizes for both a prior art slurry and a composition according to the present disclosure. The prior art polishing slurry has an LPC count that exceeds the limit taught for polishing slurries according to the present disclosure. Conversely, the polishing composition of the present disclosure has an LPC count below the limit taught for polishing slurries according to the present disclosure. The components of the two polishing slurries were chemically the same and used in the same amounts within each composition.

Two types of solid materials may be initially added when formulating a polishing composition. One type is a solid that remains solid in the composition, for example an abrasive, and another type of component would be a solid that dissolves over a period of time in the composition. The solids that remain solid over time would maintain a stable presence in the LPC count of a slurry, while the solids that dissolve would show a decreasing presence on the LPC count of the slurry and also would not pose a concern for scratching a wafer during polishing once dissolved. Conventional thinking assumes that larger particles lead to scratching defects when polishing and therefore LPC values are commonly measured and reported using bin sizes of 0.56 μm and/or 1.01 μm. That is, it is common practice to measure LPC counts of particles greater than about 0.56 μm and/or 1.01 μm and try to minimize their presence in polishing slurries.

Figure 2:
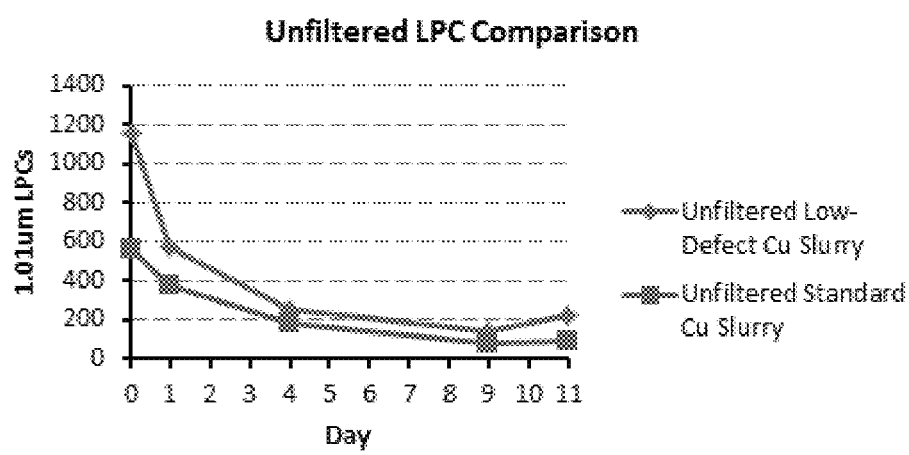
FIG. 2 shows LPC counts for an unfiltered slurry of the prior art, and an unfiltered composition according to the present disclosure, using a bin size of 1.01 μm.

FIGS. 1 and 2 show LPC counts for an unfiltered prior art slurry and an unfiltered polishing composition of the present disclosure at bin sizes of 0.56 μm and 1.01 μm, respectively. What these plots show is that the LPC's within these bin sizes for both slurries start out high and then stabilize at lower and substantially the same values as time progresses. This result indicates that LPC's within the two bin sizes are primarily dominated by components that dissolve over time and not solid abrasive components, which do not dissolve over time. Further, because the values stabilize at roughly the same values the Low Defect composition's ability to reduce defects (shown in FIGS. 7 and 8) when compared with a prior art composition is not explained by LPC values in these two size ranges.

Figure 3:
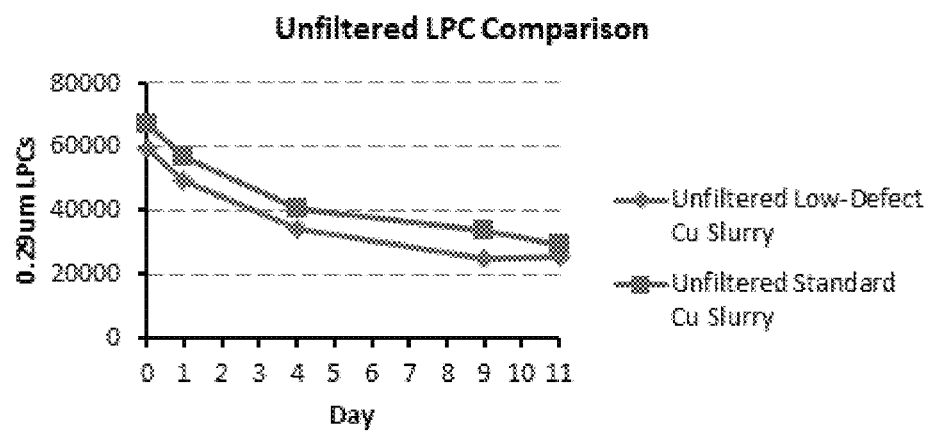
FIG. 3 shows LPC counts for an unfiltered slurry of the prior art, and an unfiltered composition according to the present disclosure, using a bin size of 0.29 μm.

FIG. 3 shows LPC counts for an unfiltered prior art slurry and an unfiltered polishing composition of the present disclosure at a bin size of 0.29 μm (i.e., counting particles with a size greater than 0.29 μm). Similar to the results for the 0.56 μm and 1.01 μm bin sizes, the results in FIG. 3 show that the LPC's within these bin sizes for both slurries start out high and then stabilize at lower and substantially the same values as time progresses. Thus, the particles within this bin size are also dominated by components that dissolve over time and do not explain the Low Defect composition's ability to reduce defects (discussed later in Example 4 and shown in FIGS. 7 and 8) when compared with a prior art composition.

Figure 4:
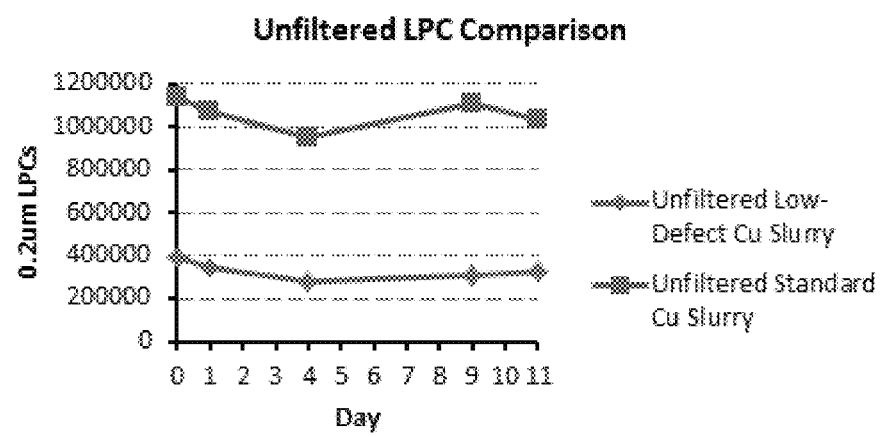
FIG. 4 shows LPC counts for an unfiltered slurry of the prior art, and an unfiltered composition according to the present disclosure, using a bin size of 0.2 μm.

FIG. 4 shows LPC counts for an unfiltered prior art slurry and an unfiltered polishing composition of the present disclosure slurry at a bin size of 0.2 μm (i.e., counting particles with a size greater than 0.2 μm). Here, the LPC counts for the two different slurries show a significant divergence. Specifically, the LPC counts remain relatively stable over the time period tested, indicating that the value is dominated primarily by the non-dissolving abrasive component. Secondly, the values obtained for prior art composition are more than double the count values obtained for the polishing composition of the present disclosure. This result, combined with the results discussed later in Example 4 and shown in FIGS. 7 and 8, unexpectedly suggests that by specifically controlling the amount of particles having a size greater than 0.2 μm a reduction in scratches/defects on polished wafers can be achieved.

Example 2

In Example 2 the copper blanket removal rate of a prior art polishing slurry is compared with the copper removal rate of the polishing composition of the present disclosure at two different downforce values. The prior art polishing slurry has an LPC count that exceeds the limit taught for polishing slurries according to the present disclosure. Conversely, the polishing composition of the present disclosure has an LPC count below the limit taught for polishing slurries according to the present disclosure. The components of the two polishing slurries were chemically the same and used in the same amounts within each composition.

Figure 5:
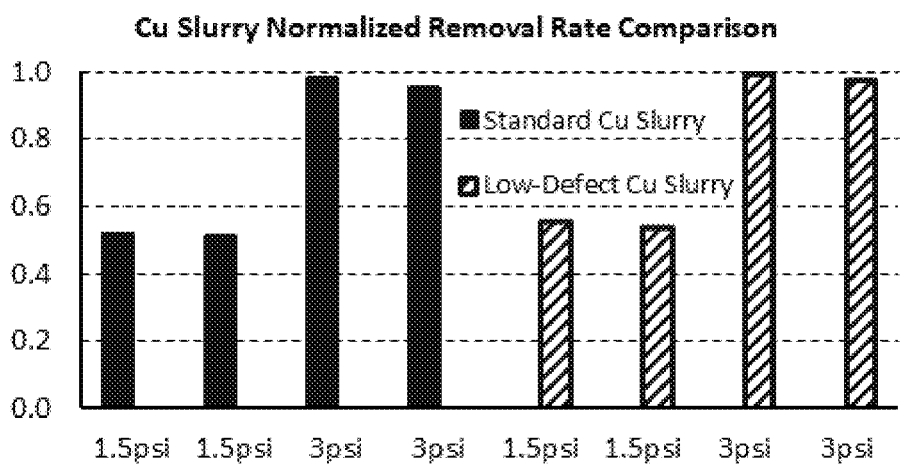
FIG. 5 is a plot showing a comparison of the normalized copper removal rate for a prior art slurry and a composition according to the present disclosure.

The results presented in FIG. 5 demonstrate that the copper removal rate for each slurry at each downforce value were comparable within normal wafer-to-wafer process variations.

Example 3

In Example 3 the dishing observed after polishing a wafer with a prior art polishing slurry is compared with the dishing observed after polishing with the polishing composition of the present disclosure. The prior art polishing slurry has an LPC count that exceeds the limit taught for polishing slurries according to the present disclosure. Conversely, the polishing composition of the present disclosure has an LPC count below the limit taught for polishing slurries according to the present disclosure. The components of the two polishing slurries used the same chemical components within each composition. Further, the polishing conditions were the same when using each composition.

Figure 6:
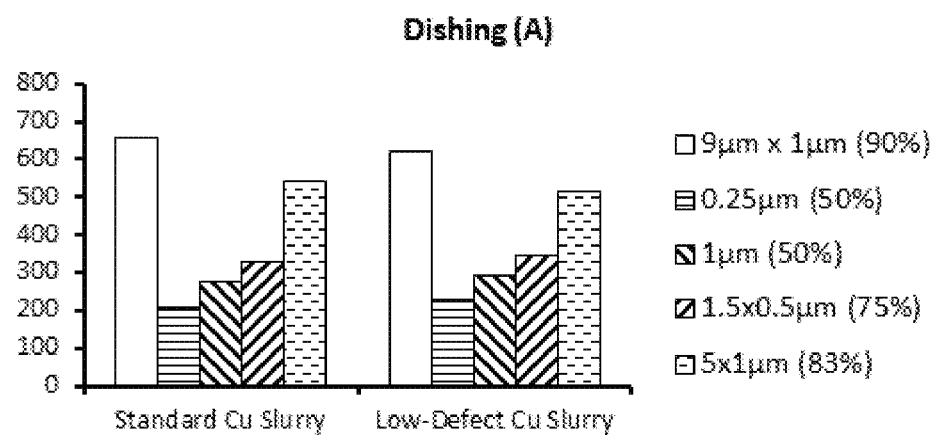
FIG. 6 is a plot showing a comparison of the dishing observed after polishing wafers having a variety of Cu patterns (i.e., line width/density) using a prior art slurry and a composition according to the present disclosure.

The results presented in FIG. 6 demonstrate that the amount of dishing observed is comparable after using the two slurries on wafers having a variety of Cu patterns (i.e., line width/density).

Example 4

In this example the total defects and type of defects found on blanket copper wafers polished with a prior art polishing slurry were compared with those found on blanket copper wafers polished with the polishing composition of the present disclosure. The prior art polishing slurry has an LPC count that exceeds the limit taught for polishing slurries according to the present disclosure. Conversely, the polishing composition of the present disclosure has an LPC count below the limit taught for polishing slurries according to the present disclosure. The components of the two polishing slurries were chemically the same and used in the same amounts within each composition. Further, the polishing conditions were the same when using each composition.

Figure 7:
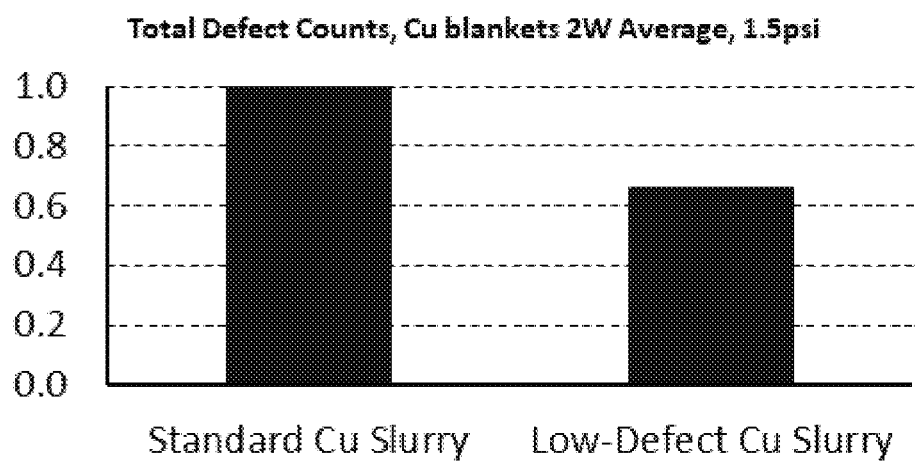
FIG. 7 shows normalized total defect counts for the composition of the present disclosure, as compared to a prior art polishing slurry.
Figure 8:
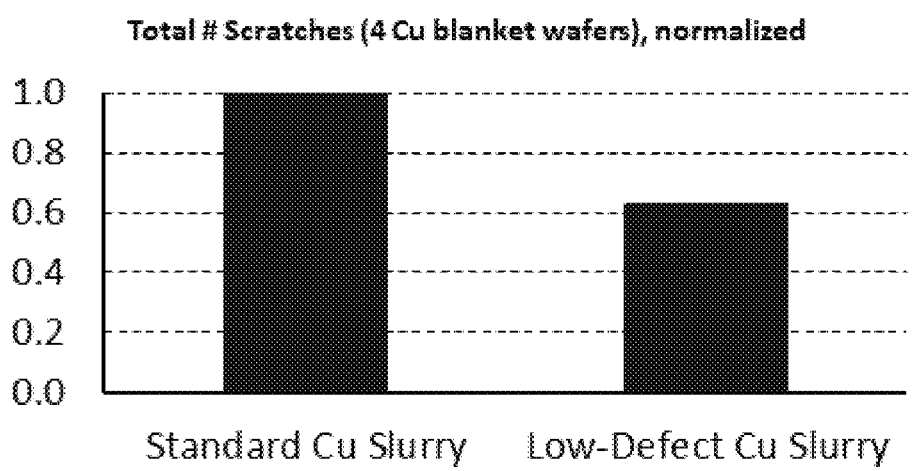
FIG. 8 shows normalized total number of scratches for the composition of the present disclosure, as compared to a prior art polishing slurry.

FIG. 7 shows that when the data is normalized the total defect counts for the polishing composition of the present disclosure are significantly lower than those observed when polishing with a prior art polishing slurry. FIG. 8 shows that when the data are normalized the total number of scratches for the polishing composition of the present disclosure are significantly lower than those observed when polishing with a prior art polishing slurry. Further, due to the strong correlation in the value obtained in FIG. 8 for the number of scratches obtained using the polishing composition of the present disclosure and the value shown in FIG. 7 for the total number of defects (i.e., the normalized values are similar at around 0.6), it can be concluded that the majority of the defects observed on the polished wafers are scratches, and not stains, organic residue, corrosion, etc. The results also show the scratches can be reduced about 40% when polishing with the polishing composition of the present disclosure.

Example 5

Figure 9:
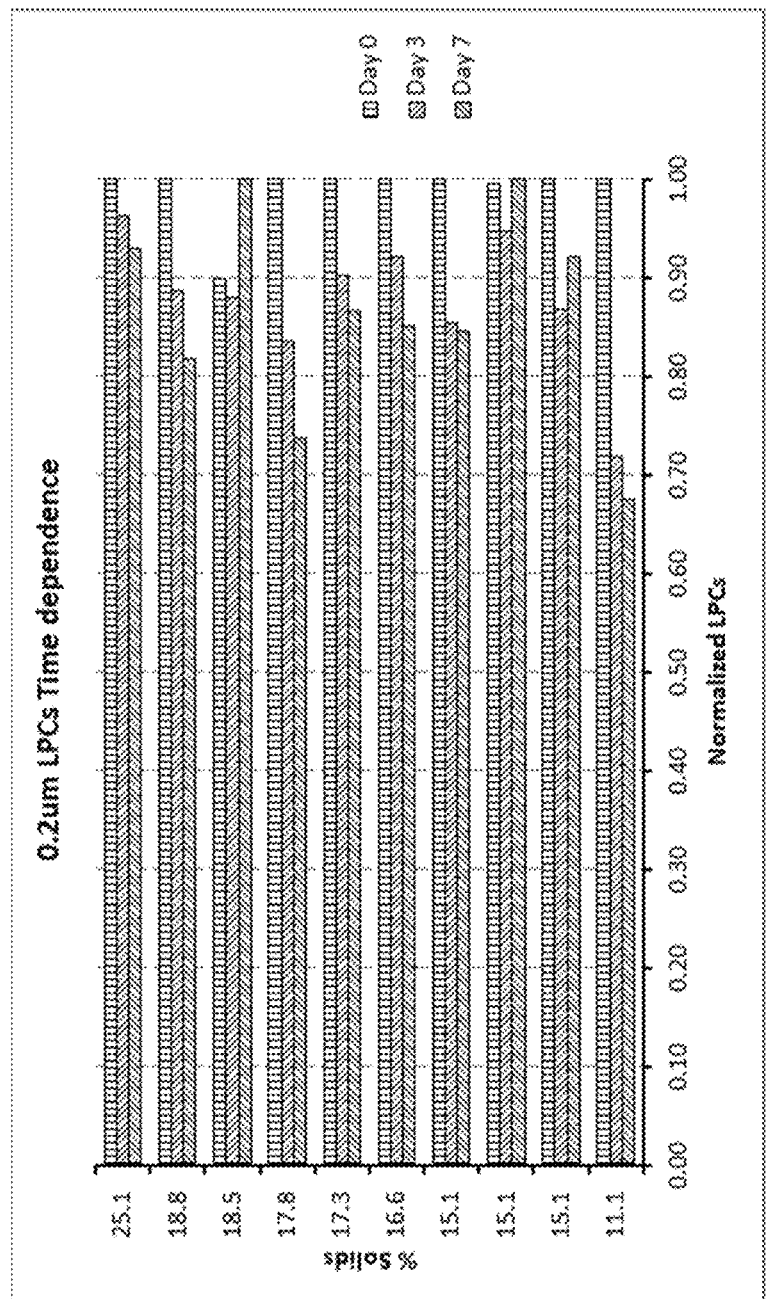
FIG. 9 shows the LPC counts at 0, 3, and 7 days of aging for ten polishing compositions using a bin size of 0.2 μm.
Figure 10:
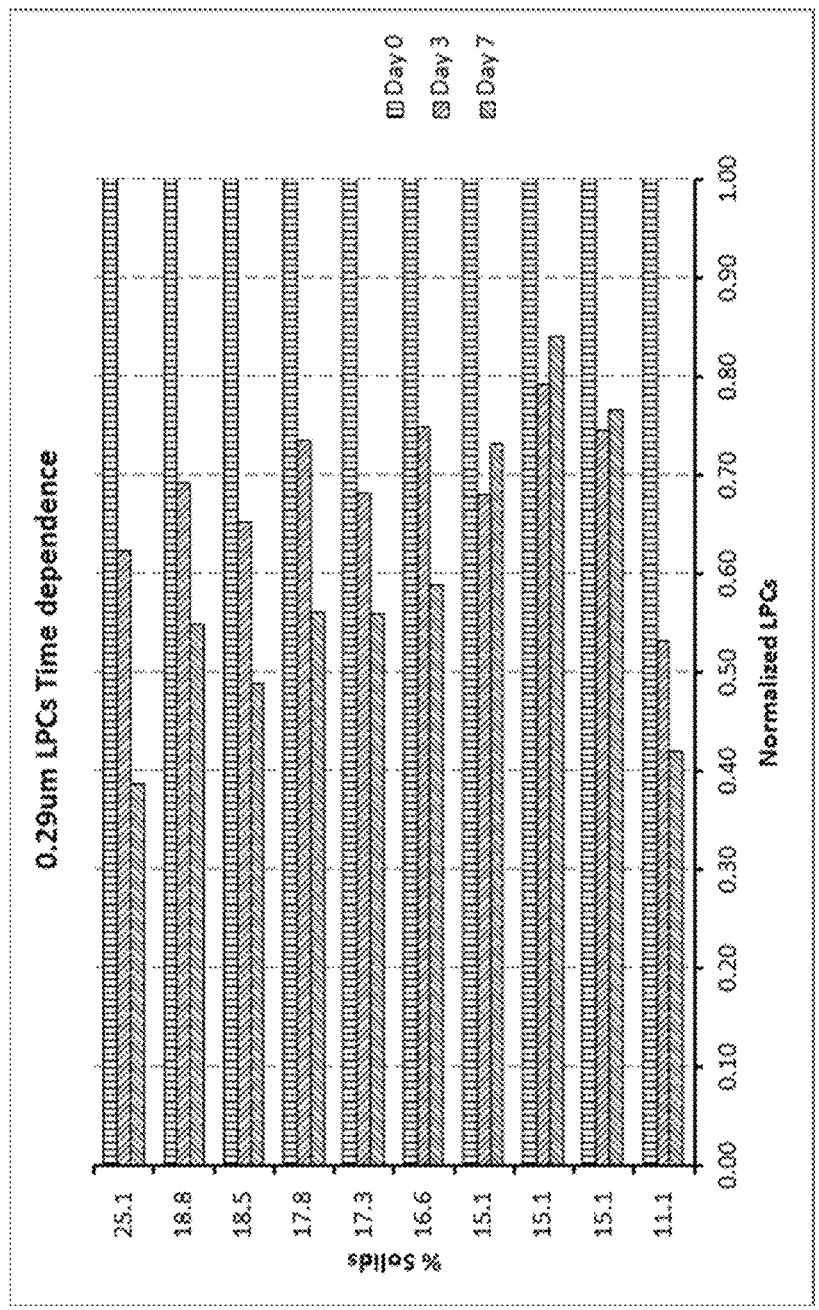
FIG. 10 shows the LPC counts at 0, 3, and 7 days of aging for ten polishing compositions using a bin size of 0.29 μm.
Figure 11:
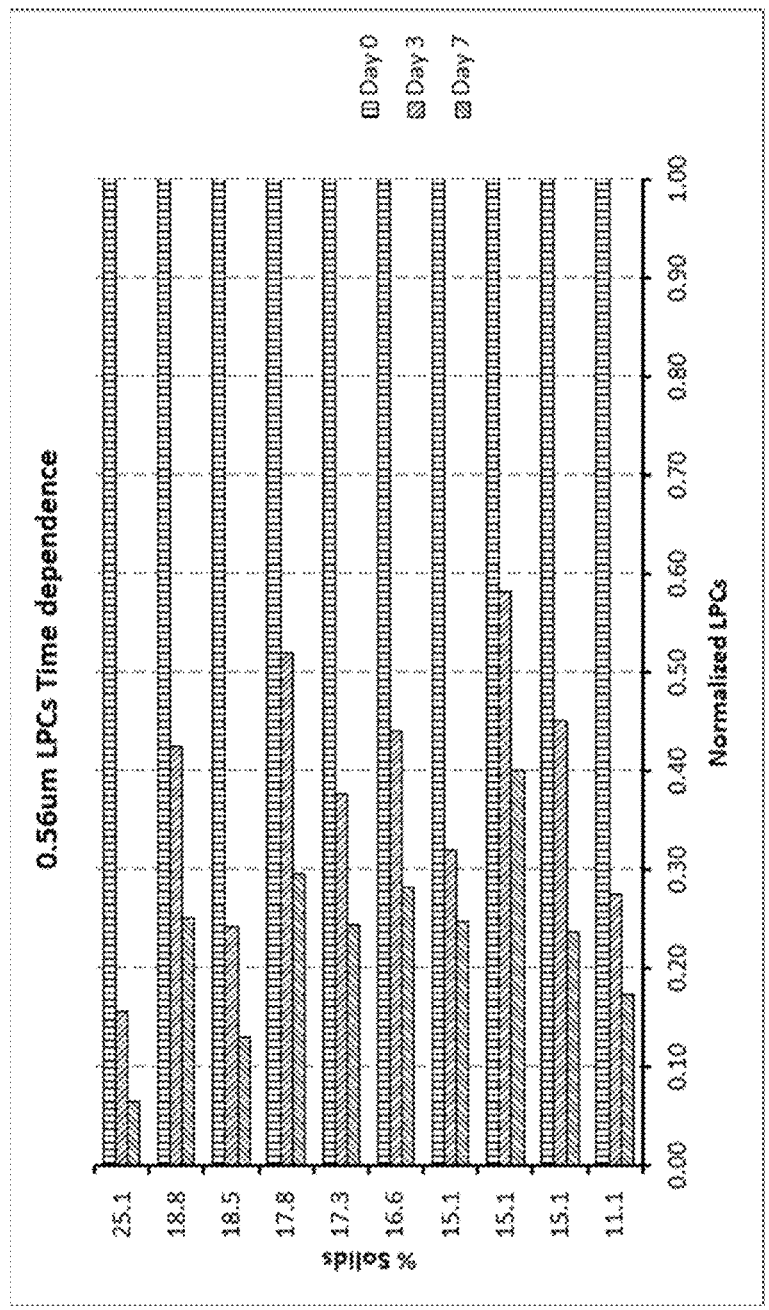
FIG. 11 shows the LPC counts at 0, 3, and 7 days of aging for ten polishing compositions using a bin size of 0.56 μm.
Figure 12:
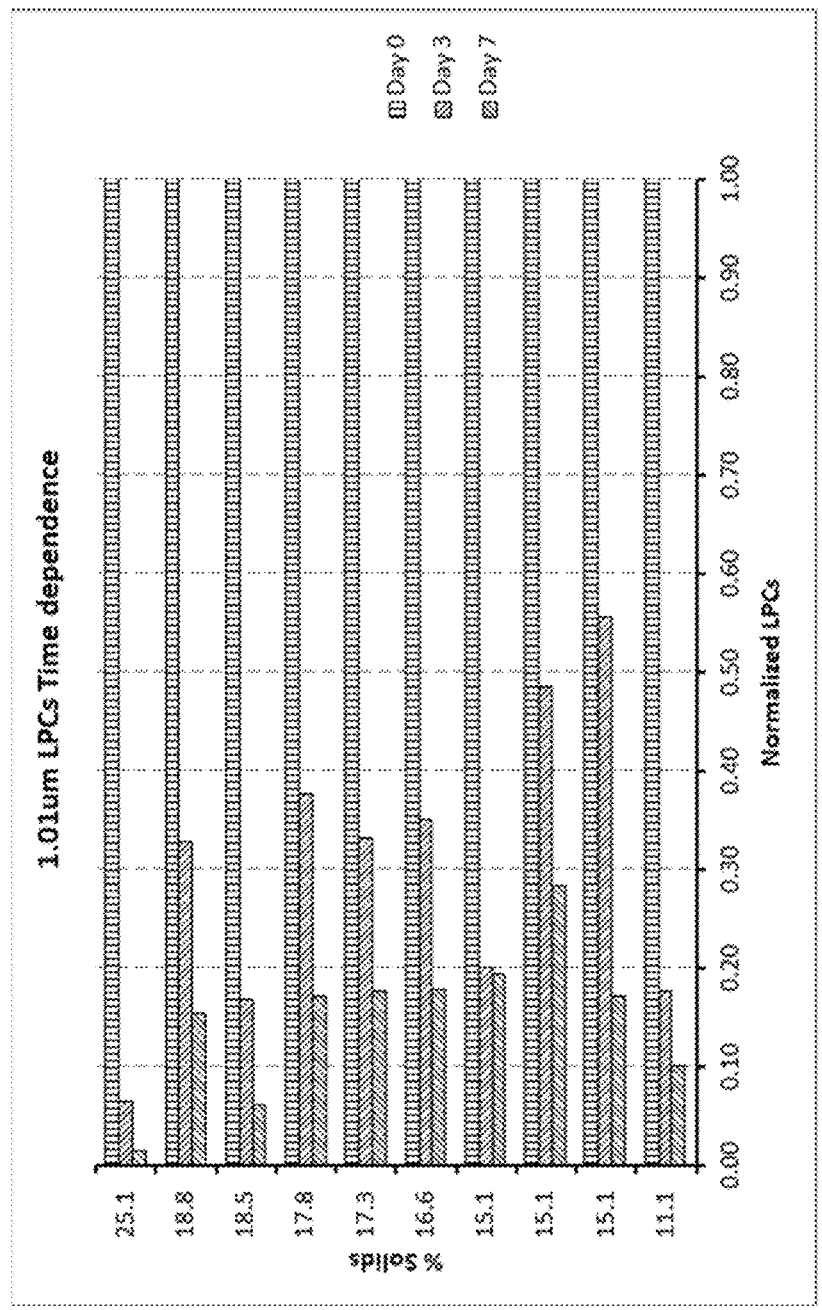
FIG. 12 shows the LPC counts at 0, 3, and 7 days of aging for ten polishing compositions using a bin size of 1.01 µm.

In this example the generality of the LPC count trends depending on bin size selection detailed in Example 1 is demonstrated by showing bar plots for ten distinct polishing compositions, each having differing components and/or amounts of components. FIG. 9 shows the LPC counts at 0, 3, and 7 days of aging for the ten polishing compositions using a bin size of 0.2 µm. FIG. 10 shows the LPC counts at 0, 3, and 7 days of aging for the ten polishing compositions using a bin size of 0.29 µm. FIG. 11 shows the LPC counts at 0, 3, and 7 days of aging for the ten polishing compositions using a bin size of 0.56 µm. FIG. 12 shows the LPC counts at 0, 3, and 7 days of aging for the ten polishing compositions using a bin size of 1.01 µm. Importantly, the LPC counts shown are normalized by the percent of solids initially added to form each composition (i.e., all solid components including abrasives and any other components added as solids during the initial formulation) so that the LPC counts may be compared even though each slurry composition is distinct.

When viewed from the smaller to larger bin sizes (i.e., FIG. 9 to FIG. 12) the LPC counts are relatively stable for all of the slurries in FIG. 9 (using a 0.2 µm bin size), while the counts decrease significantly from Day 0 to Day 3 for all of the slurries when measured at the three larger bin sizes as shown in FIGS. 10-12. This evidence bolsters the generality of the conclusions discussed in Example 1, where the abrasives were shown to primarily control the LPC counts in the 0.2 µm bin sizes, while the soluble solid components where shown to control the LPC counts in the larger and more conventionally measured bin sizes shown by the significant decrease in LPC counts over time. Further, the data also presents an explanation for why the conventionally held belief that LPC counts should be controlled in the 0.56 µm and/or 1.01 µm bin size has not correlated well with reducing defects/scratches in real world applications. Specifically, scratches are primarily caused by abrasives and the 0.56 µm and/or 1.01 µm bin size are inadequate at adequately characterizing problematic LPC counts from the non-dissolving abrasives.

Example 6

In this example the use of filtration was investigated to determine what effect filtration through a depth filter, a commonly used practice in the CMP industry, may have on the LPC count of a prior art polishing slurry and the polishing composition of the present disclosure. The prior art polishing slurry has an LPC count that exceeds the limit taught for polishing compositions according to the present disclosure prior to the filtration. Conversely, the polishing composition of the present disclosure has an LPC count below the limit taught for polishing slurries according to the present disclosure prior to the filtration. The components of the two polishing slurries were chemically the same and used in the same amounts within each composition.

Figure 13:
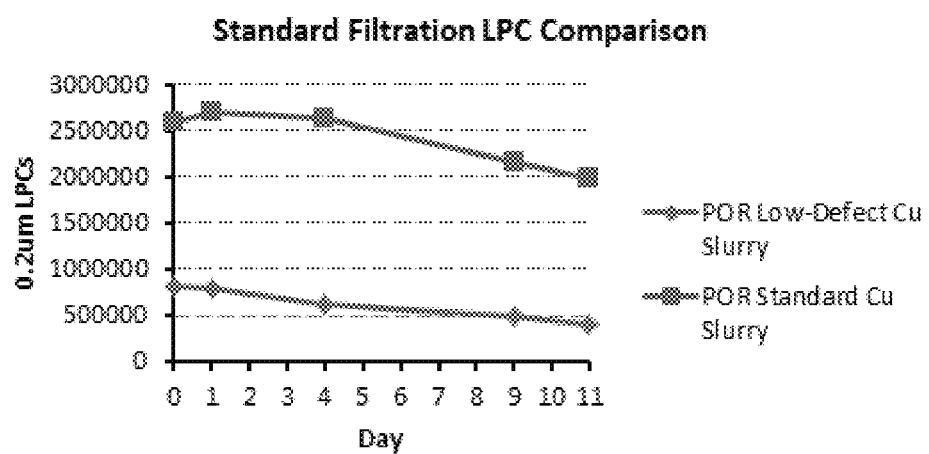
FIG. 13 shows a plot of the LPC counts, using a 0.2 µm bin size, measured over a period of 11 days for a prior art polishing slurry and a composition of the present disclosure after they have been subjected to a filtration using a 0.1 µm depth filter.

FIG. 13 shows a plot of the LPC counts, using a 0.2 µm bin size, measured over a period of 11 days for the prior art polishing composition and the polishing composition of the present disclosure after they have been subjected to a filtration using a 0.1 µm depth filter. As the plot shows, the filtration using a 0.1 µm depth filter does slightly reduce the LPC counts for both the prior art and the polishing composition of the present disclosure, but the LPC counts for the prior art polishing composition never approaches the level obtained for the polishing composition of the present disclosure.

Example 7

In this example slurries that are formulated according to the present application and comparative slurries formulated not according to the present application have their LPC counts per weight % silica abrasive used in the slurry compared. Slurries 1-4 and 6 are formulated according to the present invention, while slurries 5 and 7-10 are comparative slurries that were not formulated according to the present invention. While all slurries have slightly different formulations one primary difference is the specific silica product used in each formulation. Table 1 below summarizes the slurries.

TABLE 1

| Slurry | High Propensity for Scratching |
| --- | --- |
| 1 | No |
| 2 | No |
| 3 | No |
| 4 | No |
| 5 | Yes |
| 6 | No |
| 7 | Yes |
| 8 | Yes |
| 9 | Yes |
| 10 | Yes |

Figure 14:
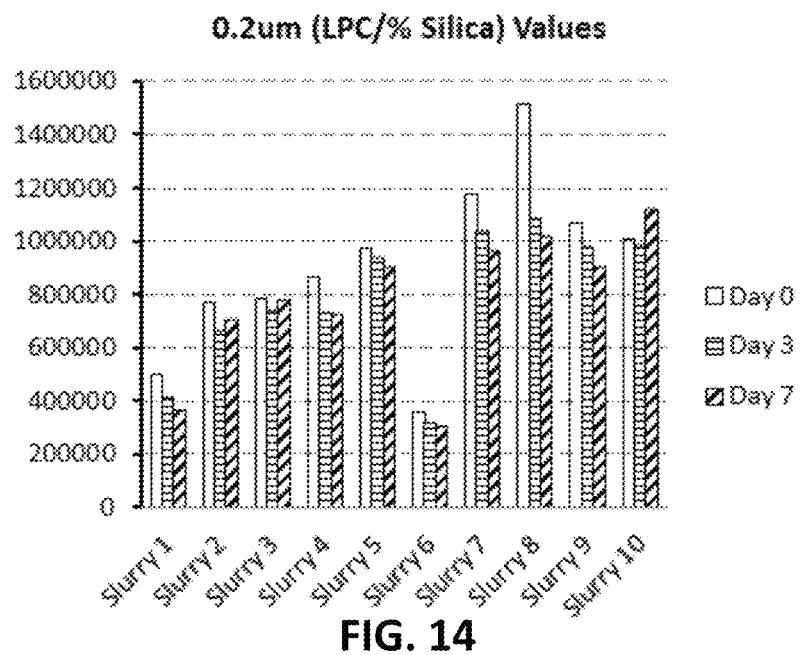
FIG. 14 shows the LPCs/weight % silica, measured at a 0.2 µm bin size, for Slurries 1-10 at 0, 3, and 7 days after formulation.

FIG. 14 shows the LPCs/weight % silica, measured at a 0.2 µm bin size, for Slurries 1-10 at 0, 3, and 7 days after formulation. Slurries 1-4 and 6 use silica abrasive products that result in appropriate levels of LPCs/weight % silica when measured at the 0.2 µm bin size (i.e., fewer than 800,000 LPCs/% silica), while slurries 5 and 7-10 use silica products that result in LPCs/weight % silica of greater than 800,000 LPCs/weight % silica. Wafers polished with slurries 1-4 and 6 showed fewer scratches than were observed on wafers polished with comparative slurries 5 and 7-10.

Figure 15:
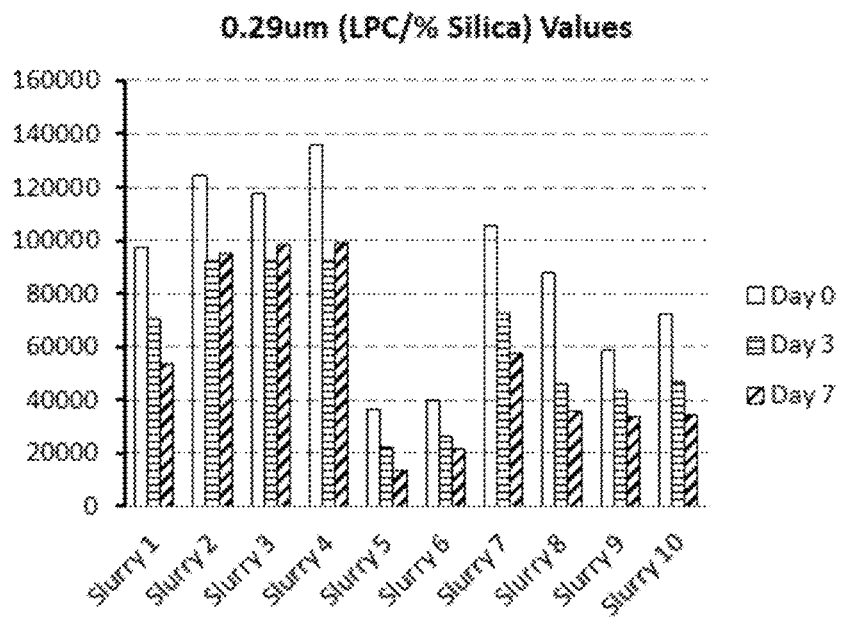
FIG. 15 shows the LPCs/weight % silica, measured at a 0.29 µm bin size, for Slurries 1-10 at 0, 3, and 7 days after formulation.

FIG. 15 shows the LPCs/weight % silica, measured at a 0.29 µm bin size, for Slurries 1-10 at 0, 3, and 7 days after formulation. Significantly, the comparative slurries (i.e., slurries 5 and 7-10) on average show lower LPC counts at this bin size than the slurries 1-4 and 6 that produce less scratches and are formulated according to the present disclosure. This result further demonstrates that LPC counts measured at bin sizes 0.29 μm or larger are not correlated well with slurries that reduce scratches/defects during polishing.

Example 8

In this example slurries that are formulated according to the present application and comparative slurries formulated not according to the present application have their LPC counts per weight % solids (i.e., abrasive and dissolvable solid components) used in the slurry compared. Slurries 1-4 and 6 are formulated according to the present invention, while slurries 5 and 7-10 are comparative slurries that were not formulated according to the present invention. The slurries used in this example are the same as the slurries used in Example 7, but the LPC counts shown in FIGS. 16-17 are instead normalized to weight % solids.

Figure 16:
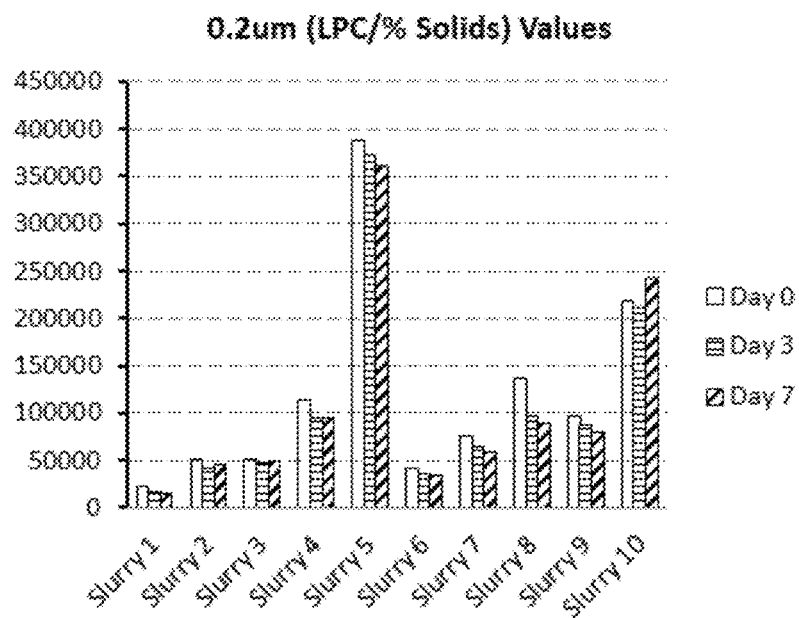
FIG. 16 shows the LPCs/weight % solids, measured at a 0.2 µm bin size, for Slurries 1-10 at 0, 3, and 7 days after formulation.
Figure 17:
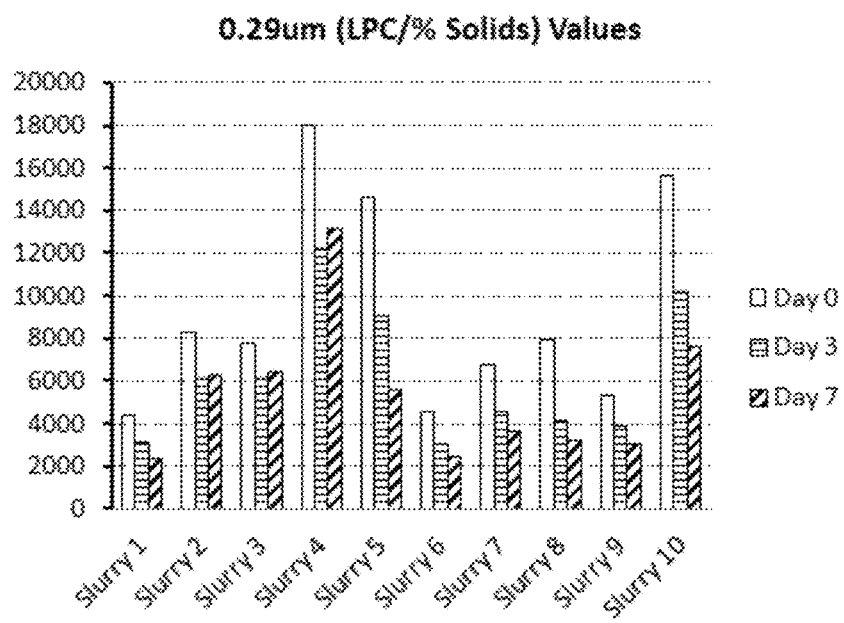
FIG. 17 shows the LPCs/weight % solids, measured at a 0.29 µm bin size, for Slurries 1-10 at 0, 3, and 7 days after formulation.

FIG. 16 shows the LPCs/weight % solids, measured at a 0.2 μm bin size, for Slurries 1-10 at 0, 3, and 7 days after formulation. As mentioned previously, Slurries 1-4 and 6 show reduced defects after polishing when compared with comparative Slurries 5 and 7-10. Thus, based on the data shown in FIG. 16, an LPC/weight % solids value of less than 50,000 would be an effective limit for a slurry to reduce defects/scratches during polishing.

FIG. 17 shows the LPCs/weight % solids, measured at a 0.29 μm bin size, for Slurries 1-10 at 0, 3, and 7 days after formulation. As shown, four of the five lowest LPCs/weight percent solids are actually Slurries 6-9, which are comparative slurries that demonstrate non-acceptable/increased scratch levels. Thus, LPC counts measured at bin sizes of 0.29 μm or larger are not correlated well with slurries that reduce scratches/defects during polishing.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:

1. A chemical mechanical polishing composition, comprising:
   an abrasive;
   a first removal rate enhancer; and
   water;
   wherein the polishing composition has a value of less than 800,000 for the relation: large particle counts/weight percent abrasive, wherein the large particle count is the total number of particles larger than 0.2 microns per milliliter of the composition.

2. The composition of claim 1, wherein the first removal rate enhancer is selected from the group consisting of organic acids, and organic acid salts, amino acids, carboxylic acids, polyamines, ammonia based compounds, quaternary ammonium compounds, inorganic acids, compounds with both carboxylic and amino functions, ethylenediaminetetraacetic acid, diethylene triamine pentaacetic acid, and any mixtures thereof.

3. The composition of claim 1, further comprising a corrosion inhibitor selected from the group consisting of azole and azole derivatives.

4. The composition of claim 1, further comprising an abrasive selected from the group consisting of alumina, fumed silica, colloidal silica, coated particles, titania, ceria, zirconia, and any mixtures thereof.

5. The composition of claim 4, wherein the abrasive is selected from the group consisting of fumed silica, colloidal silica, and mixtures thereof.

6. The composition of claim 1, wherein the amount of abrasive in the composition is at least 0.05% by weight.

7. The composition of claim 1, further comprising an oxidizer selected from the group consisting of hydrogen peroxide, ammonium persulfate, silver nitrate, ferric nitrates, ferric chloride, per acid, per salts, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMnO_4$, other inorganic or organic peroxides, and any mixtures thereof.

8. The composition of claim 1, further comprising at least one selected from the group consisting of a surfactant, a second removal rate enhancer, a biocide, a surface finisher, a pH adjuster, a defect reduction agent, a dishing reducer, a dynamic surface tension reducer, or any mixtures thereof.

9. The composition of claim 1, wherein the composition is not filtered prior to measuring the large particle counts/weight % abrasive, when measured using a 0.2 μm bin size.

10. The composition of claim 1, where the composition is aged for at least 3 days after formulation prior to measuring the large particle counts/weight % abrasive, when measured using a 0.2 μm bin size.

11. A chemical mechanical polishing composition, comprising:
   an abrasive;
   a first removal rate enhancer; and
   water;
   wherein the polishing composition has a value of less than 50,000 for the relation: large particle counts/weight percent solids, wherein the large particle count is the total number of particles larger than 0.2 microns per milliliter of the composition.

12. A method of polishing a substrate, comprising the steps of:
   applying the composition of claim 1 to the substrate; and
   applying pressure to the substrate with a polishing pad, to remove at least a portion of the surface of the substrate.

13. A method of preparing a polishing composition, wherein the polishing composition comprises:
   an abrasive;
   a first removal rate enhancer; and
   water;
   wherein the polishing composition has a value of less than 800,000 for the relation: large particle counts/weight percent abrasive, wherein the large particle count is the total number of particles larger than 0.2 microns per milliliter of the composition,
   wherein the method comprises the steps of:
   selecting the abrasive so that it conforms to the value; and
   combining the abrasive, the first removal rate enhancer, and the water.

14. The method of claim 13, wherein the abrasive is not filtered before the combining step.

15. The method of claim 14, further comprising the step of chemically treating the abrasives so that they conform to the value.

16. The method of claim 13, further comprising the step of forming the abrasives via chemical synthesis so that they conform to the value.

* * * * *

UNITED STATES PATENT AND TRADEMARK OFFICE
CERTIFICATE OF CORRECTION

PATENT NO. : 10,907,074 B2
APPLICATION NO. : 16/503198
DATED : February 2, 2021
INVENTOR(S) : James McDonough and Saul Alvarado Page 1 of 1

It is certified that error appears in the above-identified patent and that said Letters Patent is hereby corrected as shown below:

In the Claims

Claim 4, Column 11, Line 64-65, delete "further comprising an abrasive" and insert -- wherein the abrasive is --

Signed and Sealed this
Eighth Day of February, 2022

Drew Hirshfeld
*Performing the Functions and Duties of the
Under Secretary of Commerce for Intellectual Property and
Director of the United States Patent and Trademark Office*